United States Patent
Kim et al.

(10) Patent No.: US 9,379,305 B2
(45) Date of Patent: Jun. 28, 2016

(54) PIEZOELECTRIC VIBRATION MODULE

(71) Applicant: SAMSUNG ELECTRO-MECHANICS CO., LTD., Suwon (KR)

(72) Inventors: Jae Kyung Kim, Suwon (KR); Dong Sun Park, Suwon (KR); Joon Choi, Suwon (KR); Yeon Ho Son, Suwon (KR)

(73) Assignee: MPLUS CO, LTD., Suwon-Si, Gyeonggi-Do (KR)

( * ) Notice: Subject to any disclaimer, the term of this patent is extended or adjusted under 35 U.S.C. 154(b) by 451 days.

(21) Appl. No.: 13/862,930

(22) Filed: Apr. 15, 2013

(65) Prior Publication Data

US 2013/0300257 A1    Nov. 14, 2013

(30) Foreign Application Priority Data

May 8, 2012    (KR) .................. 10-2012-0048712

(51) Int. Cl.
  *H01L 41/09*    (2006.01)
  *H01L 41/053*    (2006.01)
  *B06B 1/06*    (2006.01)

(52) U.S. Cl.
  CPC .......... *H01L 41/0533* (2013.01); *B06B 1/0603* (2013.01); *H01L 41/053* (2013.01); *H01L 41/0933* (2013.01)

(58) Field of Classification Search
  USPC .................. 310/339, 311, 328, 348
  See application file for complete search history.

(56) References Cited

U.S. PATENT DOCUMENTS

| | | | | |
|---|---|---|---|---|
| 8,427,441 | B2* | 4/2013 | Paleczny et al. | 345/173 |
| 8,928,294 | B2* | 1/2015 | Yamada | 323/222 |
| 2005/0253484 | A1* | 11/2005 | Kishi et al. | 310/323.16 |
| 2010/0165794 | A1* | 7/2010 | Takahashi et al. | 367/189 |
| 2010/0171392 | A1* | 7/2010 | Mukae | 310/328 |
| 2011/0063743 | A1* | 3/2011 | Ko et al. | 359/824 |
| 2012/0212100 | A1* | 8/2012 | Lee | 310/317 |
| 2012/0248935 | A1* | 10/2012 | Liu et al. | 310/326 |

FOREIGN PATENT DOCUMENTS

| | | |
|---|---|---|
| JP | H02-94486 | 7/1990 |
| KR | 2011-0045486 | 5/2011 |
| KR | 1044208 | 6/2011 |

OTHER PUBLICATIONS

Office action dated Aug. 30, 2013 from corresponding Korean Patent Application No. 10-2012-0048712 and its English summary provided by the applicant.

* cited by examiner

*Primary Examiner* — Thomas Dougherty
(74) *Attorney, Agent, or Firm* — LRK Patent Law Firm

(57) ABSTRACT

Disclosed herein is a piezoelectric vibration module including a vibration plate that is surrounded by an upper case and a lower case, and includes a stopper capable of preventing direct collision between a piezoelectric element and an internal constituent member, for example, a lower case while vibrating linearly therein.

11 Claims, 4 Drawing Sheets

PIEZOELECTRIC VIBRATION MODULE

CROSS REFERENCE TO RELATED APPLICATION

This application claims the benefit of Korean Patent Application No. 10-2012-0048712, filed on May 8, 2012, entitled "Piezoelectric Vibration Module", which is hereby incorporated by reference in its entirety into this application.

BACKGROUND OF THE INVENTION

1. Technical Field

The present invention relates to a piezoelectric vibration module.

2. Description of the Related Art In general, in portable electronic apparatuses such as a cellular phone, an electronic book (E-book) terminal, a game machine, a PMP, and the like, a vibration function is used for various purposes.

In particular, a vibration generator for generating vibration is primarily mounted on the portable electronic apparatuses to be used as a warning function which is a silent receiving signal.

Due to implementation of multi-functions of the portable electronic apparatuses, the vibration generator actually requires miniaturization, integration, and various high-functionality at present.

Furthermore, a touch type device has been generally adopted, which performs an input operation by touching the portable electronic apparatus according to a user's request to intend to conveniently use the portable electronic apparatus.

A haptic device which is currently in common use widely includes even a concept of reflecting interface user's intuitive experience and further diversifying a feedback for a touch in addition to a concept of performing an input operation through the touch.

The haptic device generally provides vibration through repeated extension and/or shrinkage as external power is applied to a piezoelectric element. The piezoelectric element can improve moisture-resistance and durability as disclosed in an ultrasonic linear motor of Patent Document 1.

In the ultrasonic linear motor according to Patent Document 1, a protection material, for example, silicon rubber surrounds the circumference of the piezoelectric element to prevent collision with a plurality of constituent members constituting the ultrasonic linear motor so as to improve the life-span thereof as well as the performance of the piezoelectric element under an environment with high humidity or an environment with lots of dust.

However, the ultrasonic linear motor according to Patent Document 1 surrounds the rest of the parts other than a part of the piezoelectric element generating vibration force through translation movement, and as a result, extension or shrinkage deformation rate is remarkably reduced.

That is, the protection material in the related art may still cause the vibration force of the piezoelectric element from deteriorating. Therefore, another measure for protecting the piezoelectric element from external factors should be taken.

PRIOR ART DOCUMENT

Patent Document (Patent Document 1) Patent Document 1: Japanese U.M. Laid-Open Publication No. Hei 2-94486

SUMMARY OF THE INVENTION

The present invention has been made in an effort to provide a piezoelectric vibration module that can prevent direct collision with internal constituent members due to external shock of a piezoelectric element and/or unexpected large driving variation of the piezoelectric element when the piezoelectric element is activated.

According to a first preferred embodiment of the present invention, there is provided a piezoelectric vibration module, including: a piezoelectric element generating vibration force through repetition of extension and shrinkage deformation by applying external power; an upper case having a bottom surface opened and an inner space formed therein so that the piezoelectric element vibrates linearly; a lower case coupled to the bottom surface of the upper case and shielding the inner space of the upper case; and a vibration plate including a lower plate mounted with the piezoelectric element and a stopper extending vertically downward at an edge of the lower plate, and placed in the upper case and the lower case and driven vertically.

The vibration plate may include: the lower plate; a pair of upper plates that stand vertically at the centers of both sides of the lower plate; and a weight body placed between the pair of upper plates in order to increase the vibration force of the piezoelectric element.

The lower case and the lower plate may be spaced apart from each other with a predetermined gap therebetween.

The length of the stopper may be shorter than a spaced distance between the lower case and the lower plate and the stopper may extend more than the thickness of the piezoelectric element.

The stopper may be made of the same material as the lower plate.

The stopper may be made of a rigid material.

The stopper may be arranged at the edge to be symmetric around the center of the lower plate.

The stopper may be provided at one edge of two edges that are arranged in parallel with each other in a longitudinal direction of the lower plate or at both edges.

The stopper may be placed to be adjacent to both ends of the lower plate.

According to a second preferred embodiment of the present invention, there is provided a piezoelectric vibration module, including: a piezoelectric element generating vibration force through repetition of extension and shrinkage deformation by applying external power; an upper case having a bottom surface opened and an inner space formed therein so that the piezoelectric element vibrates linearly; a lower case coupled to the bottom surface of the upper case and shielding the inner space of the upper case; and a vibration plate including a lower plate mounted with the piezoelectric element and a stopper extending vertically downward at an edge of the lower plate and placed in the upper case and the lower case and driven vertically.

The vibration plate may include: the lower plate; a pair of upper plates that stand vertically at the centers of both sides of the lower plate; and a weight body placed between the pair of upper plates in order to increase the vibration force of the piezoelectric element.

The lower case and the lower plate may be spaced apart from each other with a predetermined gap therebetween.

The length of the stopper may be shorter than a spaced distance between the lower case and the lower plate and the stopper may extend more than the thickness of the piezoelectric element.

The stopper may be made of the same material as the lower plate.

The stopper may be made of a rigid material.

The stopper may be provided at one edge of two edges that are arranged in parallel with each other in a longitudinal direction of the lower plate.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
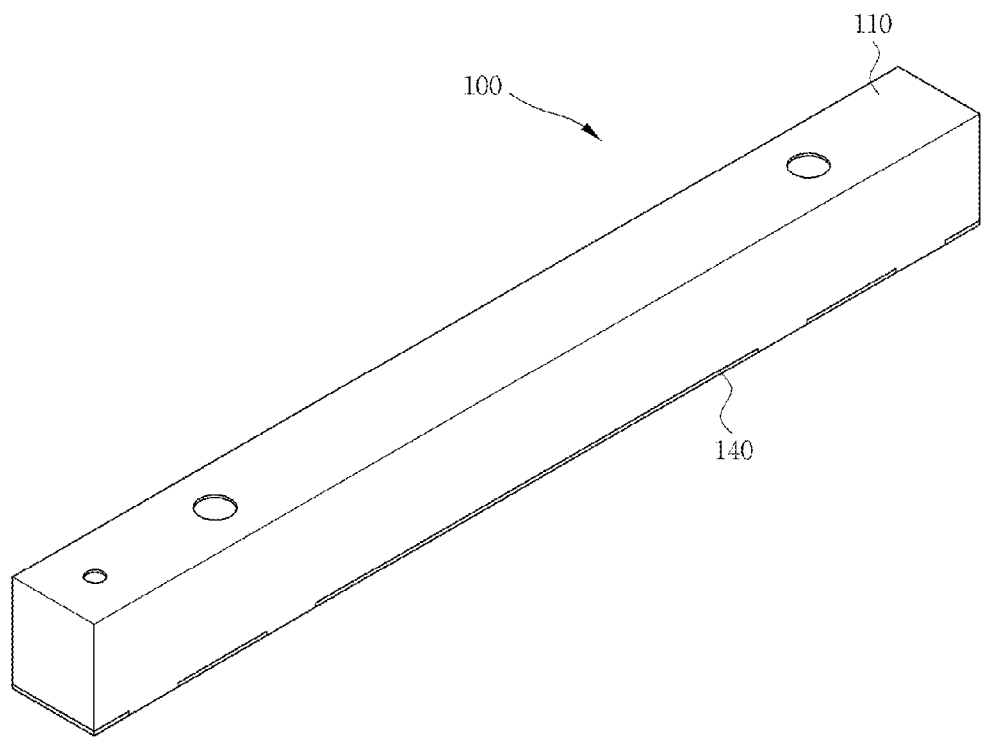
FIG. 1 is a perspective view of a piezoelectric vibration module according to a first preferred embodiment of the present invention.

The objects, features and advantages of the present invention will be more clearly understood from the following detailed description of the preferred embodiments taken in conjunction with the accompanying drawings. Throughout the accompanying drawings, the same reference numerals are used to designate the same or similar components, and redundant descriptions thereof are omitted. Further, in the following description, the terms "first", "second", "one side", "the other side" and the like are used to differentiate a certain component from other components, but the configuration of such components should not be construed to be limited by the terms. Further, in the description of the present invention, when it is determined that the detailed description of the related art would obscure the gist of the present invention, the description thereof will be omitted.

Hereinafter, preferred embodiments of the present invention will be described in detail with reference to the attached drawings.

Figure 2:
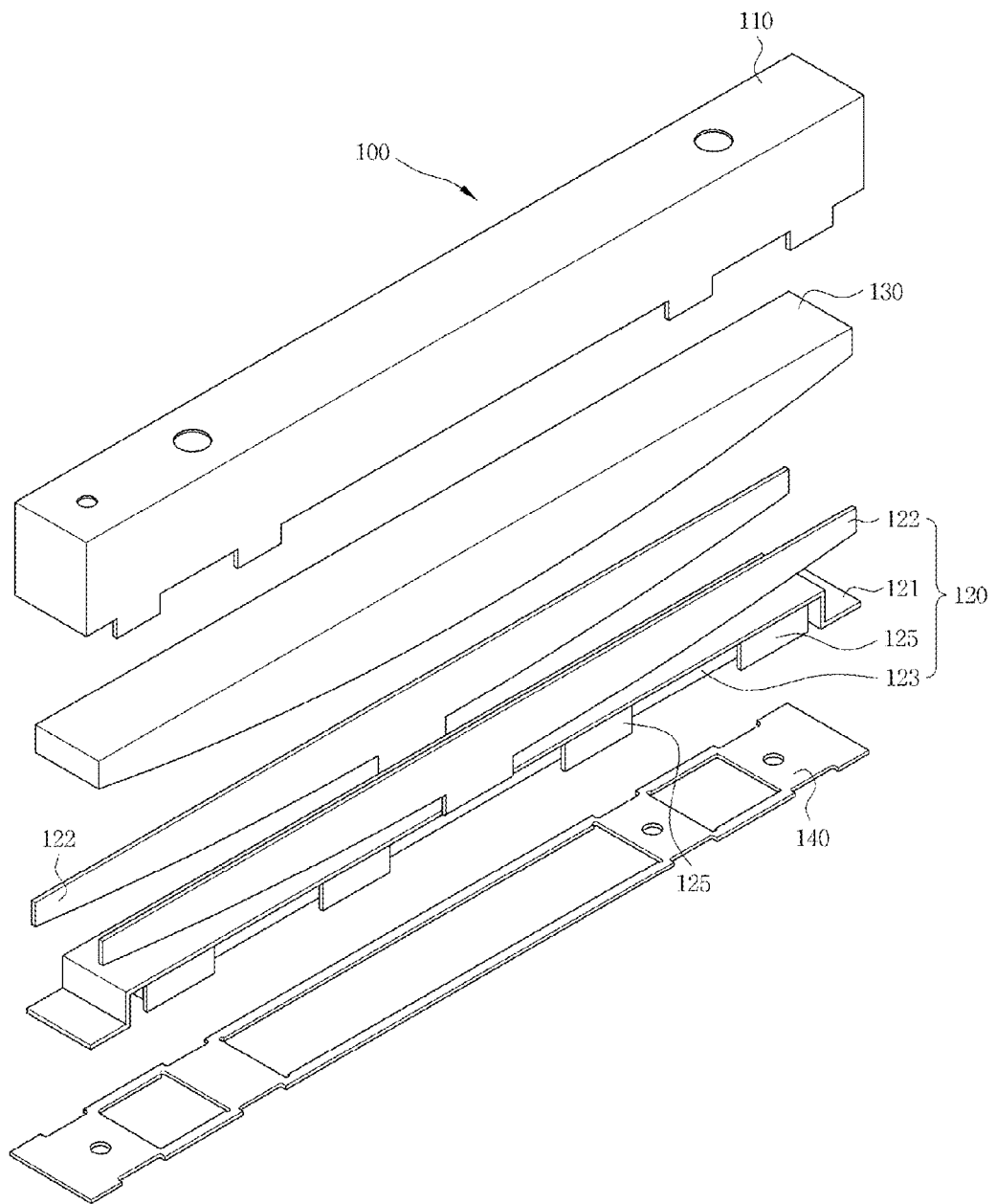
FIG. 2 is an exploded perspective view of the piezoelectric vibration module illustrated in FIG. 1.

FIG. 1 is a perspective view of a piezoelectric vibration module according to a first preferred embodiment of the present invention. FIG. 2 is an exploded perspective view of the piezoelectric vibration module illustrated in FIG. 1.

As illustrated in the figures, the piezoelectric vibration module 100 according to the first preferred embodiment of the present invention includes an upper case 110, a vibration plate 120, a weight body 130, and a lower case 140. The piezoelectric vibration module 100 is used as a means for transferring vibration force to a touch screen panel (not illustrated).

The upper case 100 has a box shape in which one surface is opened and receives a driving body, that is, the vibration plate 120 mounted with a piezoelectric element 123.

The vibration plate 120 transfers vibration force of the piezoelectric element 123 to external components by a bending operation through repetition of extension and shrinkage transformation integrally with the piezoelectric element 123 as described above and includes a generally flat lower plate 121. The piezoelectric element 130 is mounted on one flat surface of the lower plate 121 and the weight body 130 is mounted or placed on the other surface of the lower plate 121.

The vibration plate 120 may include a printed circuit board (PCB) (not illustrated) that applies power for driving the piezoelectric element 123.

Alternatively, the vibration plate 120 may include a pair of upper plates 122 that stand vertically upward on both sides of the lower plate 121 together with the flat lower plate 121 as described above. The upper plate 122 is coupled to the center of the lower plate 121. Each of the lower plate 121 and the upper plate 121 may be formed by a single integral component and may be fixedly coupled by various bonding methods unlike the above.

The vibration plate 120 is made of a metallic material having elastic force, for example, SUS to be transformed integrally with the piezoelectric element 123 which repeatedly extends or shrinks according to application of external power. When the vibration plate 120 and the piezoelectric element 123 are coupled to each other by the bonding coupling method, the vibration plate 120 may be made of invar which is a material having a similar thermal expansion coefficient as the piezoelectric element so as to prevent a bending phenomenon which may occur by hardening of a bonding member.

As described above, the vibration plate 120 is made of invar having the similar thermal expansion coefficient as the piezoelectric element 123, such that thermal stress is reduced, which is generated when the piezoelectric element 123 operates or is subjected to thermal shock even under a high-temperature external environment, thereby preventing a piezoelectric deterioration phenomenon in which an electric characteristic deteriorates.

The pair of upper plates 122 are arranged in parallel to each other as large as for example, the width of the lower plate 121, and as a result, the weight body 130 may be placed between the pair of upper plates 122. The weight body 130 as a medium that maximally increases vibration force is inclined upward toward both ends from the center of the weight body 130 in order to prevent contact with the lower plate 121 of the vibration plate 120. As described above, in a structure in which the vibration plate 120 includes the upper plate 122, since the weight body 130 does not contact the lower plate 122, the piezoelectric element 123 may be arranged on one flat surface of the lower plate 122.

For reference, the weight body 130 may be made of the metallic material and the weight body 130 is preferably made of a tungsten material having relatively high density in the same volume.

The lower case 140 is formed by a generally elongated planar plate. In this case, the lower case 140 has a size and a shape to close the opened bottom surface of the upper case 110.

The upper case 110 and the lower case 140 may be coupled to each other in various methods such as caulking, welding, and bonding which have already widely been known to those skilled in the art.

Figure 3:
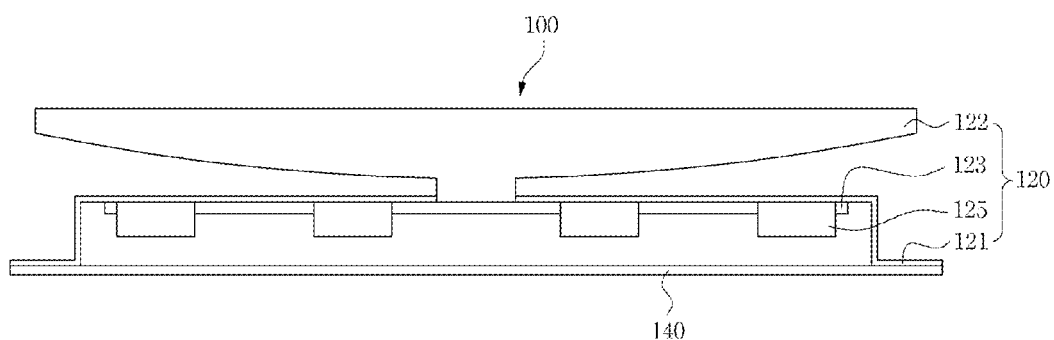
FIG. 3 is a front view schematically illustrating the piezoelectric vibration module according to the first preferred embodiment of the present invention except for an upper case.

FIG. 3 is a front view schematically illustrating the piezoelectric vibration module according to the first preferred embodiment of the present invention except for an upper case. The vibration plate 120 is spaced apart from the lower case 140 in parallel with each other with a predetermined gap therebetween. Preferably, the lower plate 121 of the vibration plate 120 is coupled and fixed to both ends of the lower case 140 through steps formed at both ends thereof. Besides, the lower plate 121 is positioned on the lower case 140 with protrusions (not illustrated) at both ends thereof to form a space between the lower case 140 and the lower plate 121.

As illustrated above, the piezoelectric vibration module 100 according to the first preferred embodiment of the present invention includes the vibration plate 120, in more detail, a stopper 125 at an edge of the lower plate 121. Preferably, the stopper 125 is formed integrally with the lower plate 121. In this case, the stopper 125 may be fixed by various coupling methods.

The stopper 125 is made of the same material as the lower plate 121 and is preferably made of a rigid material which is not almost elastically transformed due to a high elastic coefficient thereof. The stopper 125 of the present invention is not limited thereto and may be made of a flexible material.

In particular, the stopper 125 may prevent the piezoelectric element 123 from being damaged due to direct contact between the lower plate 121 or the piezoelectric element 123 and the lower case 140 when the piezoelectric vibration module 100 of the present invention is externally shocked, particularly, when the piezoelectric vibration module 100 drops or when the piezoelectric element 123 collides with the internal constituent members depending on the increase of the driving variation of the piezoelectric element 123. To this end, the stopper 125 extends vertically downward at the edge of the lower plate 121 and extends shorter than a spaced distance between the lower plate 121 and the lower case 140 so as not to influence driving of the vibration plate 120. That is, the stopper 125 is spaced apart from the lower case 140 with a predetermined gap therebetween without directly contacting the lower case 140.

The stopper 125 preferably extends more than the thickness of the piezoelectric element 123 attached to the lower plate 121. The piezoelectric element 123 attached to the lower plate 121 does not contact the lower case 140 in unexpected driving variation of the lower plate 121.

The stopper 125 extends vertically downward at the edge of the lower plate 121 that extends in a longitudinal direction (long side) as described above. Therefore, preferably, the stopper 125 is formed vertically downward at edges close to both ends of the lower plate 121, while the stopper is symmetrically placed at the center of the lower plate 121. Alternatively, the stopper 125 may extend vertically downward at the edge of the lower plate 121 that extends in a crossing direction (short side).

The stopper 125 may be formed at only one edge between two edges that extend in the longitudinal direction of the lower plate 121 or at two edges. In the latter case, the stoppers 125 that are arranged in parallel with each other are spaced apart from each other in the same as or more than the width of the piezoelectric element 123.

As a result, the vibration plate 120 may improve drop reliability by protecting the piezoelectric element 123 and the lower case 140 to protect the contact between the piezoelectric element 123 and the lower case 140 at the time of moving vertically.

When power is applied to the piezoelectric element 123, the piezoelectric element 123 is fully attached to the lower plate 121, such that a movement occurs at the center of the lower plate 121 through extension or shrinkage deformation. Since the movement occurs while the lower plate 121 is fixed to both ends of the lower case 140, the center of the vibration plate 120 is deformed vertically.

Moreover, the piezoelectric element 123 may be configured to be stacked in a single-layer type or a multi-layer type. The piezoelectric element stacked in the multi-layer type may ensure an electric field required to drive the piezoelectric element at lower external voltage. Therefore, driving voltage of the piezoelectric vibration module 100 according to the present invention may be lowered, and as a result, in the present invention, the piezoelectric element 123 stacked in the multi-layer type is preferably adopted.

As widely known to those skilled in the art, the piezoelectric element 123 may be made of various materials and particularly, made of polymer.

The piezoelectric vibration module according to the present invention may further include a rubber damper (not illustrated) together with the stopper. Alternatively, in the piezoelectric vibration module of the present invention, the rubber damper made of the elastic material is placed between the vibration plate and the upper case and between the vibration plate and the lower case to serve to absorb shock among the respective constituent members while driving.

Figure 4A:
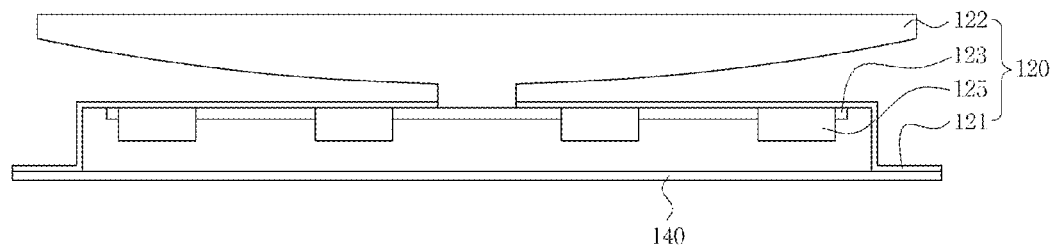
FIGS. 4A and 4C are diagram illustrating a driving process of the piezoelectric vibration module illustrated in FIG. 3.
Figure 4B:
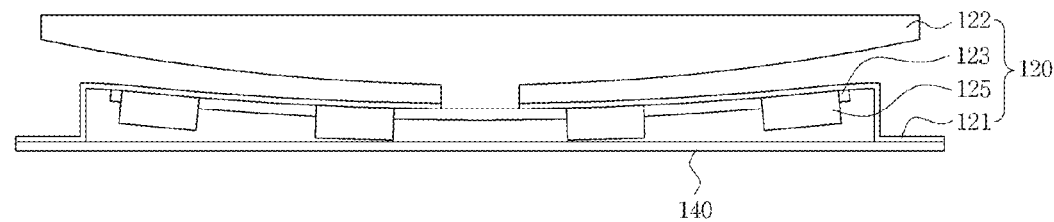
Figure 4C:
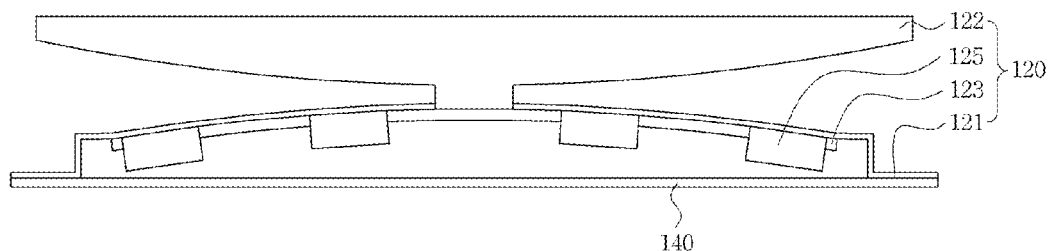

FIGS. 4A to 4C are diagrams illustrating a driving process of the piezoelectric vibration module 100 illustrated in FIG. 3. The piezoelectric vibration module 100 according to the first preferred embodiment of the present invention is coupled to an image display unit such as a touch screen panel or an LCD to transfer vibration force to the outside.

FIG. 4A is a front view of the piezoelectric vibration module 100 before external power is applied. FIG. 4B is a front view of the piezoelectric vibration module 100 in which the length of the piezoelectric element 123 is increased when power is applied. When the length of the piezoelectric element 123 increases, deformation rate of the lower plate 121 is relatively small and the lower plate 121 is fixed to the lower case 140, and as a result, the vibration plate 120 is bent and driven downward. When the piezoelectric element 123 extends, the vibration plate 120 varies to be close to the lower case 140 while the driving variation of the vibration plate 120 is increased due to the drop or abnormal activation of the piezoelectric element 123, thereby causing unnecessary collision. In this case, the stopper 125 of the vibration plate 120 contacts the lower case 140 to prevent the piezoelectric element 123 from being broken due to impact force.

FIG. 4C is a front view of the piezoelectric vibration module 100 in which the length of the piezoelectric element 123 is decreased when power is applied. When the length of the piezoelectric element 123 decreases, the lower plate 121 is bent and driven upward.

As illustrated in the figure, a user of a haptic device with the piezoelectric element 123 may sense vibration feedback by vertical vibration.

Figure 5:
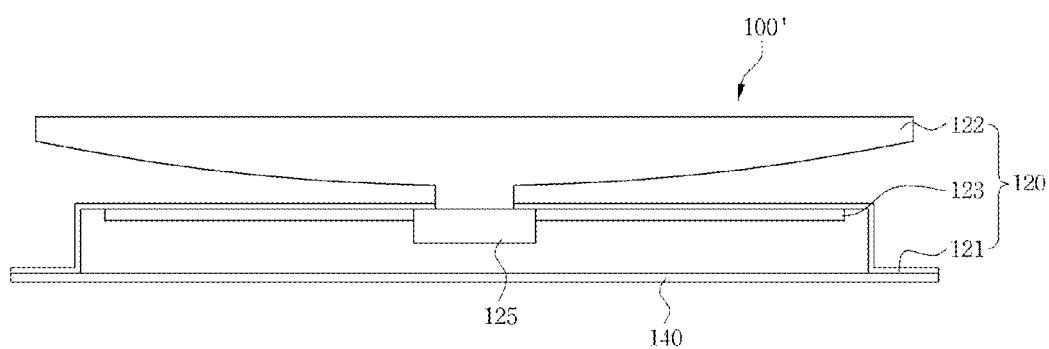
FIG. 5 is a diagram schematically illustrating a piezoelectric vibration module according to a second preferred embodiment of the present invention.

As illustrated in FIG. 5, a piezoelectric vibration module 100' according to a second preferred embodiment of the present invention includes a stopper 125 at the center of the lower plate 121. The stopper 125 is formed integrally with the lower plate 121. In this case, the stopper 125 is not limited thereto, however, the stopper may be fixed by various coupling methods.

The stopper 125 extends vertically downward at the center (in other words, a junction point between the lower plate 121 and the upper plate 122) of the vibration plate 120, in particular, the lower plate 121 and the length of the stopper 125 should be shorter than the spacedc distance between the flat lower palate 121 and the lower case 140 which are arranged in parallel with each other.

The stopper 125 preferably extends more than the thickness of the piezoelectric element 123 attached to the lower plate 121. The piezoelectric element 123 attached to the lower plate 121 does not contact the lower case 140 in unexpected driving variation of the lower plate 121.

The stopper 125 may be made of the same material as the lower plate 122. The stopper 125 is made of the rigid material, and as a result, since the stopper 125 has a high elastic coefficient, the stopper 125 is made of a rigid material which is not almost elastically transformed. The stopper 125 of the present invention may be made of the flexible material as necessary.

According to preferred embodiments of the present invention, there is provided a piezoelectric vibration module that can prevent a driving body configured by a piezoelectric element capable of providing vibration force from directly colliding with internal constituent members.

In particular, the piezoelectric vibration module includes a collision absorbing member that can protect the piezoelectric element without influencing the vibration force generated by activation of the piezoelectric element.

Although the embodiments of the present invention have been disclosed for illustrative purposes, it will be appreciated that the present invention is not limited thereto, and those skilled in the art will appreciate that various modifications, additions and substitutions are possible, without departing from the scope and spirit of the invention.

Accordingly, any and all modifications, variations or equivalent arrangements should be considered to be within the scope of the invention, and the detailed scope of the invention will be disclosed by the accompanying claims.

What is claimed is:

1. A piezoelectric vibration module, comprising:
   a piezoelectric element generating vibration force through repetition of extension and shrinkage deformation by applying external power;
   an upper case having a bottom surface opened and an inner space formed therein;
   a lower case coupled to the bottom surface of the upper case and shielding the inner space of the upper case; and
   a vibration plate including a lower plate at which the piezoelectric element is mounted and a stopper extending vertically downward at an edge of the lower plate, the vibration plate placed in the inner space of the upper case and the lower case and being driven vertically by the extension and shrinkage deformation of the piezoelectric element, wherein
   the stopper is extended spaced apart from the lower case with a gap, and the length of the extension of the stopper is shorter than a space distance between the lower plate and the lower case, and wherein the piezoelectric element is prevented from being damaged due to direct contact with the lower plate.

2. The piezoelectric vibration module as set forth in claim 1, wherein the vibration plate further includes;
   a pair of upper plates that stand vertically upward at the centers of both sides of the lower plate; and
   a weight body placed between the pair of upper plates in order to increase the vibration force of the piezoelectric element.

3. The piezoelectric vibration module as set forth in claim 1, wherein the lower case and the lower plate are spaced apart from each other with a predetermined gap therebetween.

4. The piezoelectric vibration module as set forth in claim 1, wherein the stopper is made of the same material as the lower plate.

5. The piezoelectric vibration module as set forth in claim 1, wherein the stopper is made of a rigid material.

6. The piezoelectric vibration module as set forth in claim 1, wherein one or more rubber dampers are further provided between the vibration plate and the upper case or between the vibration plate and the lower case.

7. The piezoelectric vibration module as set forth in claim 1, wherein one or more stoppers are symmetrically provided at the edge around the center of the rectangular lower plate.

8. The piezoelectric vibration module as set forth in claim 1, wherein the stopper is provided at one edge of two edges that are arranged in parallel with each other in a longitudinal direction of the lower plate.

9. The piezoelectric vibration module as set forth in claim 1, wherein the stopper is placed to be adjacent to both ends of the lower plate.

10. The piezoelectric vibration module as set forth in claim 1, wherein the length of the extension of the stopper greater than the thickness of the piezoelectric element.

11. The piezoelectric vibration module as set forth in claim 1, wherein the stopper is extended in vertically downward direction at the center of the edge of the lower plate.

* * * * *